(12) United States Patent
Lam et al.

(10) Patent No.: US 7,475,369 B1
(45) Date of Patent: Jan. 6, 2009

(54) ELIMINATE FALSE PASSING OF CIRCUIT VERIFICATION THROUGH AUTOMATIC DETECTING OF OVER-CONSTRAINING IN FORMAL VERIFICATION

(75) Inventors: William K. Lam, Newark, CA (US); Shrenik M. Mehta, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 373 days.

(21) Appl. No.: 11/083,805

(22) Filed: Mar. 18, 2005

(51) Int. Cl.
G06F 17/50 (2006.01)
G06F 9/45 (2006.01)

(52) U.S. Cl. .................. 716/5; 716/4; 716/18; 703/13; 703/14

(58) Field of Classification Search .................. 716/1, 716/3–5, 18; 703/13–22
See application file for complete search history.

(56) References Cited

U.S. PATENT DOCUMENTS

| | | | | |
|---|---|---|---|---|
| 6,074,426 A | * | 6/2000 | Baumgartner et al. | 703/13 |
| 6,182,258 B1 | * | 1/2001 | Hollander | 714/739 |
| 6,493,852 B1 | * | 12/2002 | Narain et al. | 716/5 |
| 6,748,352 B1 | * | 6/2004 | Yuen et al. | 703/16 |
| 6,931,611 B2 | * | 8/2005 | Martin et al. | 716/5 |
| 6,938,228 B1 | * | 8/2005 | Zhong | 716/4 |
| 7,039,883 B2 | * | 5/2006 | Krishnamurthy | 716/3 |

\* cited by examiner

*Primary Examiner*—Jack Chiang
*Assistant Examiner*—Nghia M Doan
(74) *Attorney, Agent, or Firm*—Hickman Palermo Truong & Becker LLP

(57) ABSTRACT

Techniques are disclosed for automatically determining whether a potential constraint set to be applied to a portion of a circuit are overconstrained. An environment circuit supplies inputs to the circuit portion. Embodiments of the invention recognize that if the environment circuit produces a set of outputs that contain a pattern that is not present in the potential constraint set, then the potential constraint set is overconstrained. A verification tool establishes the properties for the environmental circuit based on the potential constraint set. If the verification tool determines that the outputs produced by the environment circuit conflict with the properties of the environment circuit, then the verification tool concludes that the potential constraint set is overconstrained, because the environment circuit produces a pattern that is not present in the potential constraint set. Advantageously, the laborious and error-prone process of manually determining the proper inputs to apply during formal verification is avoided.

10 Claims, 8 Drawing Sheets

ELIMINATE FALSE PASSING OF CIRCUIT VERIFICATION THROUGH AUTOMATIC DETECTING OF OVER-CONSTRAINING IN FORMAL VERIFICATION

BACKGROUND

When a circuit is being designed, to verify the design of the circuit (or a component thereof), the circuit (or the component thereof) may undergo a process called formal verification. The purpose of formal verifications is to verify that the portion of the circuit being tested (referred to herein as the "component under test" or "CUT") behaves as intended.

To perform formal verification, a set of inputs is applied to the CUT to produce a set of outputs. In response to applying the set of inputs to the CUT, if the set of outputs produced by the CUT ("the produced outputs") do not conflict with a set of conditions established for the CUT, then the CUT passes formal verification. The set of conditions that the outputs of the CUT must meet are referred to as the "specification," or the "properties," of the CUT. Thus, when performing formal verification, the produced outputs of the CUT are verified to ensure that the produced outputs of the CUT conform to the specification, or the properties, of the CUT.

The inputs applied to the CUT during formal verification correspond to the inputs provided to the CUT in a real-world deployment. The circuitry providing the CUT with inputs is referred to as the "environment circuit". To illustrate, consider FIG. 1, which is a block-diagram illustrating a circuit having an environment circuit and a CUT. As shown in FIG. 1, the outputs 102 produced by the environment circuit 112 correspond to the inputs 102 to the CUT 114.

When a CUT undergoes formal verification, the set of inputs applied to the CUT may be "constrained" by limiting the set of inputs applied to the CUT to those inputs the CUT would actually experience when the circuit is deployed. In this way, instead of applying all the possible inputs to the CUT when performing formal verification, only those inputs that the environment circuit would provide to the CUT in a real-world deployment are used. This process of restricting the set of inputs used in performing formal verification is called "constraining." The motivation for constraining the inputs applied to the CUT is that the CUT may fail formal verification based on a set of inputs that the CUT will never experience in a real-world deployment. Thus, when performing formal verification, it is only necessary to test those inputs that the CUT will actually experience in a real-world deployment.

Typically, a circuit designer performs the process of constraining manually. That is, the circuit designer manually specifies inputs that can be applied to the CUT. However, it is possible for the circuit designer to either underconstrain or overconstrain the set of inputs that are applied to the CUT during formal verification.

If inputs, which the CUT will never experience in a real-world deployment, are applied to the CUT during formal verification, then the inputs applied to the CUT are said to be underconstrained. In other words, the CUT is being tested with more inputs than the CUT will actually experience in a real-world deployment. Typically, undercontraining the inputs applied to the CUT when performing formal verification does not create serious problems, because (a) if the CUT passes formal verification with the applied inputs being underconstrained, then the CUT is simply more robust than the CUT needs to be, and (b) undercontraining is relatively easy to detect since it often causes the CUT to fail formal verification since the CUT was never designed to operate under the inputs being applied.

On the other hand, overconstraining the inputs applied to the CUT during formal verification does present serious problems for the circuit designer. If less than all of the inputs that the CUT will experience in a real-world deployment are applied to the CUT during formal verification, then the inputs applied to the CUT are said to be overconstrained. In other words, the CUT is being tested with fewer inputs than the CUT will actually experience in a real-world deployment.

Overconstraining presents the danger that the circuit designer may reasonably conclude that the design of the CUT contains no errors since the CUT passed formal verification; however, since less than all of the inputs the CUT will experience in a real-world deployment were tested, it is possible that the CUT contains an error that will cause the CUT to not behave as intended when the untested inputs are applied to the CUT.

Currently, a circuit designer manually verifies that the inputs being applied to a CUT during formal verification are not underconstrained or overconstrained. Since this verification process is performed manually, it is susceptible to human error. Applicants are not aware of any existing mechanism or methodology that allows a set of constraints to be verified with certainty.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

SUMMARY

In accordance with one embodiment of the present invention, a more systematic and automated approach is provided for determining with certainty whether a set of inputs to a CUT are overconstrained. As shown in FIG. 1, the environment circuit 112 provides the input to the CUT 114. Put another way, the output from the environment circuit 112 represents the input to the CUT 114. Because of this output/input relationship, when a circuit designer imposes constraints on the input to the CUT 114, he is, in effect, also imposing corresponding restrictions on the properties of the environment circuit 112. Thus, if the input to the CUT 114 is overconstrained, then the output of the environment circuit 112 violates the properties of the environment circuit 112 That being the case, it is possible to determine whether the input to the CUT 114 has been overconstrained by determining whether the output of the environment circuit 112 violates the properties of the environment circuit 112. If the output of the environment circuit 112 violates the properties of the environment circuit 112, then it follows that the input to the CUT 114 has been overconstrained. This is the approach taken in one embodiment of the present invention to determine whether the input to the CUT 114 has been overconstrained.

In an embodiment of the present invention, a circuit designer may use a verification tool to establish the properties for an environmental circuit 112 based on the potential constraint set to a CUT 114. The verification tool may then apply a set of environmental inputs to the environment circuit 112 to produce a set of outputs. If the verification tool determines that the outputs produced by the environment circuit 112 conflict with the properties of the environment circuit 112, then the verification tool concludes that the potential constraint set is overconstrained, because the environment circuit 112 produces a pattern that is not present in the potential constraint set. Advantageously, the laborious and error-prone process of manually determining the proper inputs to apply during formal verification is avoided.

BRIEF DESCRIPTION OF THE DRAWINGS

Embodiments of the present invention are illustrated by way of example, and not by way of limitation, in the figures of the accompanying drawings and in which like reference numerals refer to similar elements and in which.

DETAILED DESCRIPTION OF EMBODIMENT(S)

In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form in order to avoid unnecessarily obscuring the embodiments of the invention described herein.

Conceptual Overview

Figure 1:
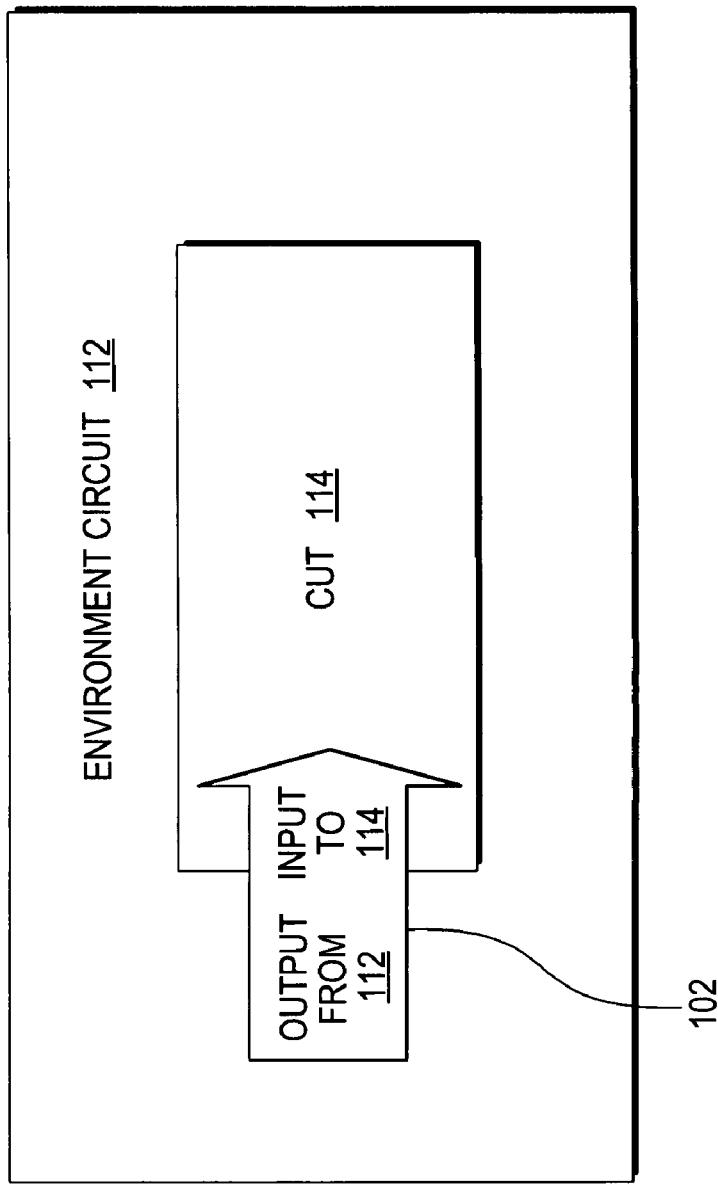
FIG. 1 is a block-diagram illustrating circuit having an environment circuit and a CUT.

As shown in FIG. 1, the environment circuit 112 provides the input to the CUT 114. Put another way, the output from the environment circuit 112 represents the input to the CUT 114. Because of this output/input relationship, when a circuit designer imposes constraints on the input to the CUT 114, he is, in effect, also imposing corresponding restrictions on the properties of the environment circuit 112. Thus, if the input to the CUT 114 is overconstrained, then the output of the environment circuit 112 violates the properties of the environment circuit 112 That being the case, it is possible to determine whether the input to the CUT 114 has been overconstrained by determining whether the output of the environment circuit 112 violates the properties of the environment circuit 112. If the output of the environment circuit 112 violates the properties of the environment circuit 112, then it follows that the input to the CUT 114 has been overconstrained. This is the approach taken in one embodiment of the present invention to determine whether the input to the CUT 114 has been overconstrained.

As it is possible to determine whether the input to the CUT 114 has been overconstrained by analyzing whether the output of the environment circuit 112 violates the properties of the environment circuit 112, existing tools for determining whether the output of the environment circuit 112 violates the properties of the environment circuit 112 may be used by embodiments of the invention to determine whether inputs to the CUT 114 have been overconstrained.

Implementation Overview

Techniques are disclosed herein for using a verification tool to automatically determine whether a possible set of inputs ("a potential constraint set") to be applied to a CUT are overconstrained. An environment circuit supplies inputs to the CUT. Embodiments of the invention operate under the recognition that if the environment circuit produces a set of outputs that contain a pattern that is not present in the potential constraint set, then the potential constraint set is overconstrained. Thus, to aid the determination of whether the potential constraint set is overconstrained, the verification tool may establish the properties for the environmental circuit based on the potential constraint set.

Embodiments of the invention enable a user to use a verification tool to (a) determine whether a potential constraint set is overconstrained, and (b) perform formal verification. The verification tool may be implemented using a computer system that allows a user (who could be anybody, but for simplicity shall be referred to herein as a circuit designer) to interact with the verification tool. For example, the verification tool may be implemented in software, and the circuit designer may interact with the verification tool using a display, a variety of input devices and/or cursor controls, described in further detail below. The verification tool allows the circuit designer to create and store data that describes a potential constraint set and circuit components, such as the CUT and the environment circuit. For example, the verification tool may allow the circuit designer to design potential constraint sets and circuit components using a hardware description language (HDL) or test bench language.

Figure 2:
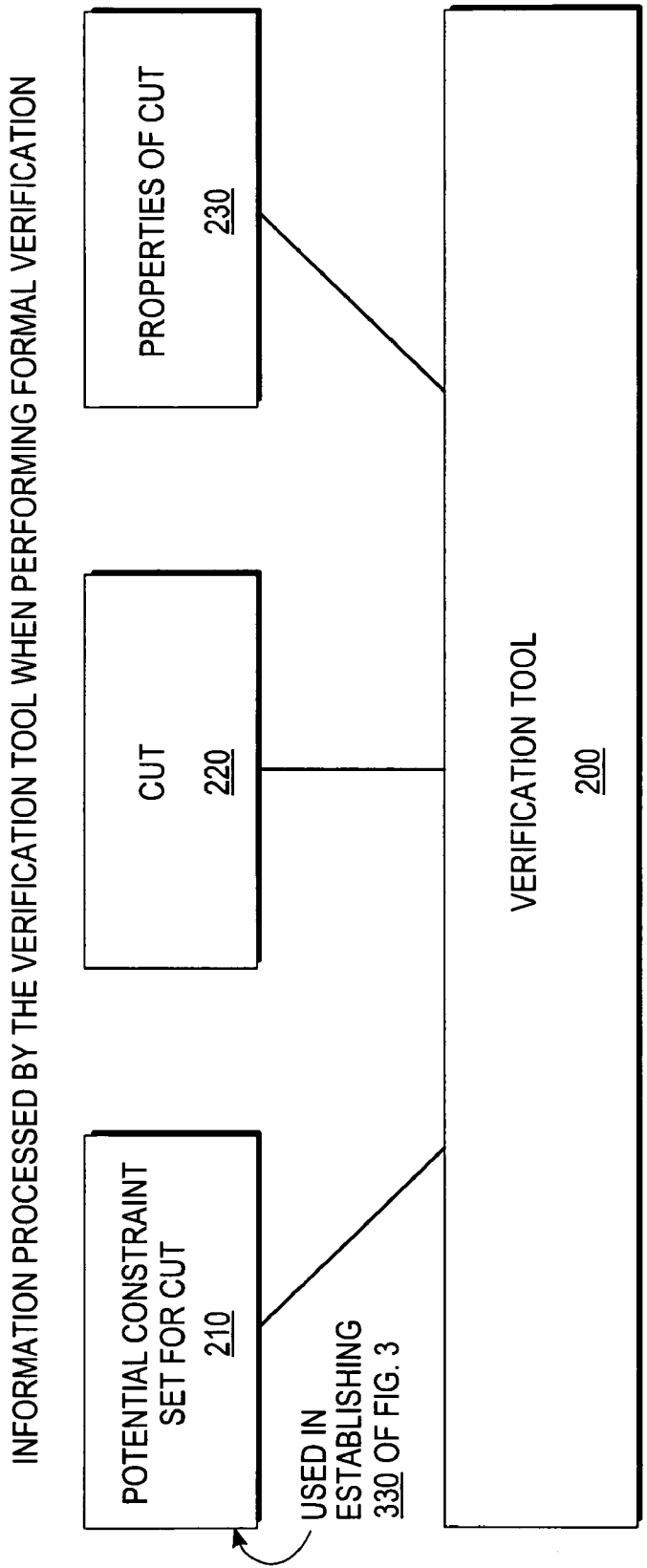
FIG. 2 is a block diagram illustrating the information processed by the verification tool according to a first embodiment of the invention.

To illustrate how a circuit designer may use the verification tool to perform formal verification, consider FIG. 2, which is a block diagram illustrating the information processed by the verification tool 200 according to a first embodiment of the invention. As shown in FIG. 2, the verification tool 200 processes data describing the potential constraint set 210 for the CUT and data describing the CUT 220. The verification tool 200 may apply the potential constraint set 210 to the CUT 220 to generate data describing the produced outputs of the CUT 220. The verification tool 200 may then determine whether the produced outputs conform to the properties of the CUT 230.

In addition to performing formal verification, the verification tool may be used to determine whether the potential constraint set 210 applied to the CUT 220 are overconstrained. Once the circuit designer has used the verification tool 200 to store data describing the potential constraint set 210, the verification tool 200 may use the data describing the potential constraint set 210 to establish a set of conditions for an environmental circuit. Once the circuit designer instructs the verification tool 200 to establish the set of conditions, the circuit designer need not manually intervene, as the verification tool 200 may use the potential constraint set 210 to automatically establish the set of conditions. In establishing the set of conditions, the verification tool 200 may use the logic indicated in the potential constraint set, but update some of the signal names in the logic to reflect the names of the outputs produced by the environment circuit.

Figure 3:
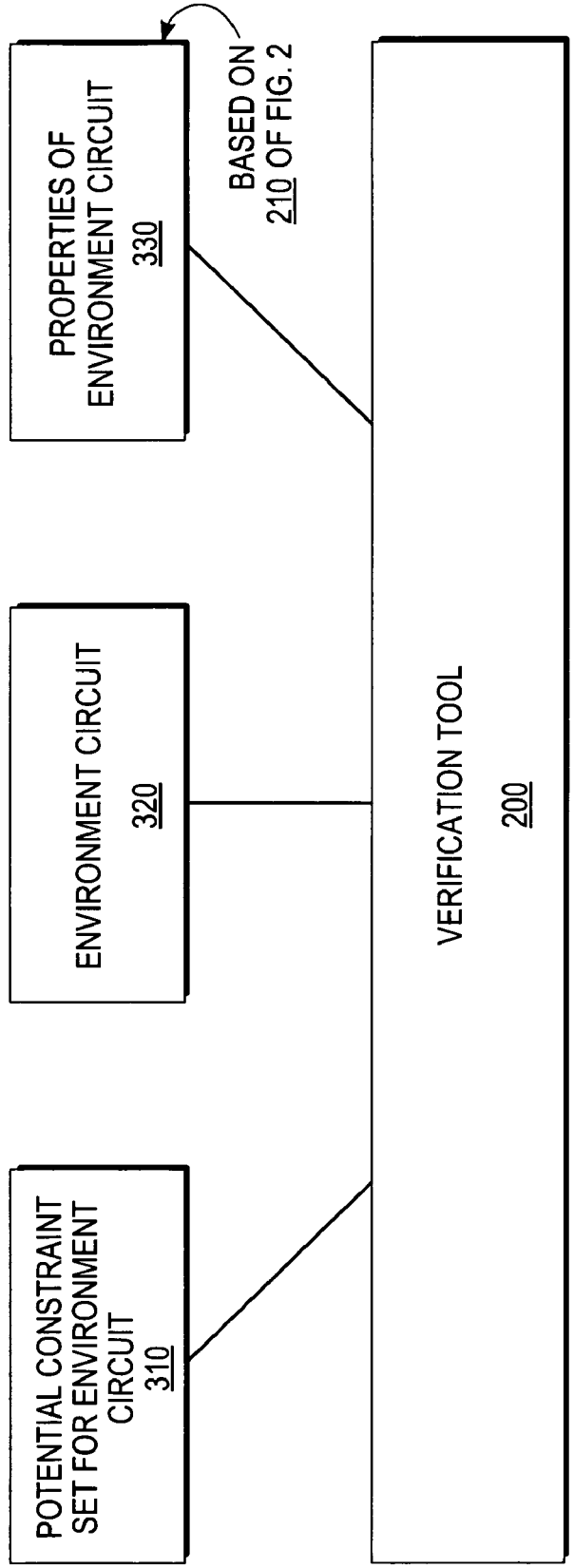
FIG. 3 is a block diagram illustrating the information processed by the verification tool according to a second embodiment of the invention.

To illustrate how the set of conditions established for the environment circuit may be used by the verification tool 200, consider FIG. 3, which is a block diagram illustrating the information processed by the verification tool 200 according to a second embodiment of the invention. As shown in FIG. 3, the verification tool 200 processes data describing a constraint set for the environment circuit 320 and data describing the environment circuit 320. The verification tool 200 may apply the potential constraint set 310 to the environment circuit 320 to generate data describing the produced outputs of the environment circuit 320. The verification tool 200 may then determine if the produced outputs of the environment circuit 320 conflict with the properties 330 of the environment circuit 320.

Importantly, the properties 330 of the environment circuit 320 were created by the verification tool 200 based on the potential constraint set 210. Thus, if the verification tool 200 determines that the produced outputs of the environment circuit 320 conflict with the properties 330 of the environment circuit 320, then the verification tool 200 determines that the potential constraint set 210 is overconstrained, because the environment circuit 320 produces a pattern that is not present in the potential constraint set 210.

Advantageously, embodiments of the invention prevent errors or bugs in the design of a CUT to escape detection during formal verification. Additionally, embodiments of the invention eliminate the laborious and error-prone process of manually determining the proper inputs to apply to the CUT during formal verification. Having described the high-level overview of an embodiment of the invention, the process of determining whether a potential constraint set overconstrains inputs that can be applied to a CUT shall now be described in further detail.

Figure 4:
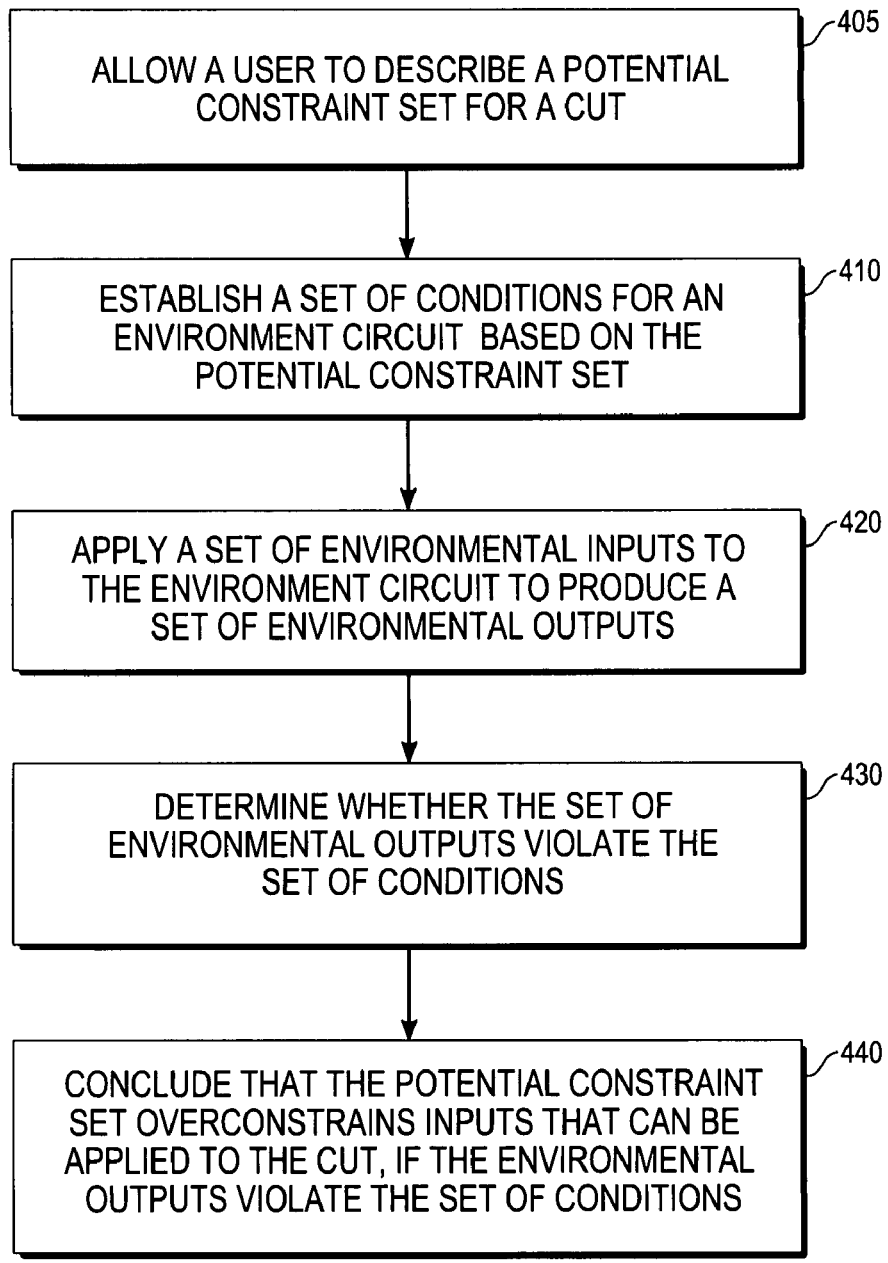
FIG. 4 is a flowchart depicting the steps of determining whether a potential constraint set overconstrains inputs that can be applied to a CUT according to an embodiment of the invention.

Determining Whether a Potential Constraint Set Overconstrains Inputs that can be Applied to a Cut FIG. 4 is a flowchart depicting the steps of determining whether a potential constraint set overconstrains inputs that can be applied to a CUT according to an embodiment of the invention. The steps of FIG. 4 shall be explained below with reference to FIG. 5, which is a block diagram illustrating a circuit having an environment circuit and a CUT according to an embodiment of the invention.

In step 410, a set of conditions for the environment circuit 510 are established by the verification tool based on a potential constraint set. The potential constraint set is a possible set of inputs to be applied to the CUT 520. The verification tool allows, in step 405, the circuit designer to design and store data describing the potential constraint set. For example, the verification tool may store data describing the potential constraint set in a HDL or a test bench language. Illustrative examples of a HDL include Verilog and VHDL. By performing the remaining steps of FIG. 4, the verification tool can automatically determine whether the potential constraint set is overconstrained.

Based on the data the circuit designer has configured to describe the potential constraint set, the verification tool automatically establishes the set of conditions. The purpose of the set of conditions established in step 410 is to define conditions for the outputs signals produced by the environment circuit 510. For example, the established set of conditions may indicate that the outputs from the environment circuit 510 should only consist of a set of output patterns and should not include any other output patterns. After inputs are applied to the environment circuit 510, then outputs produced by the environment circuit 510 will be compared against the established set of conditions, as explained in further detail below.

In an embodiment, to establish the set of conditions, the verification tool may copy the logic indicated in the potential constraint set, but update the signal names in the logic to reflect the names of the outputs produced by the environment circuit. For example, as shown in FIG. 5, the output signals produced by the environment circuit 510 are named A and B, while the input signals to the CUT 520 are named Y and Z.

The circuit designer may use the verification tool to configure data to describe the potential constraint set for inputs Y and Z. For example, the potential constraint set may indicate that all possible combinations of Y and Z are to be applied to the CUT 520, except those patterns where Y is equal to Z. The verification tool, in performing step 410, may copy the logic of the potential constraint set, and update signal names Y and Z with the names of the outputs signals A and B respectively. In this example, the verification tool would then establish the properties for the environment circuit 510 as all possible combinations of A and B are allowable, except those patterns where A is equal to B. In other examples, if the circuit designer stored data describing the potential constraint set of the CUT 520 using a HDL, the verification tool may copy the data describing the potential constraint set of the CUT 520 to establish to the set of conditions for the environment circuit 510, but update the data to replace the names of the inputs to the CUT 520 with the corresponding output from the environment circuit 510.

Figure 5:
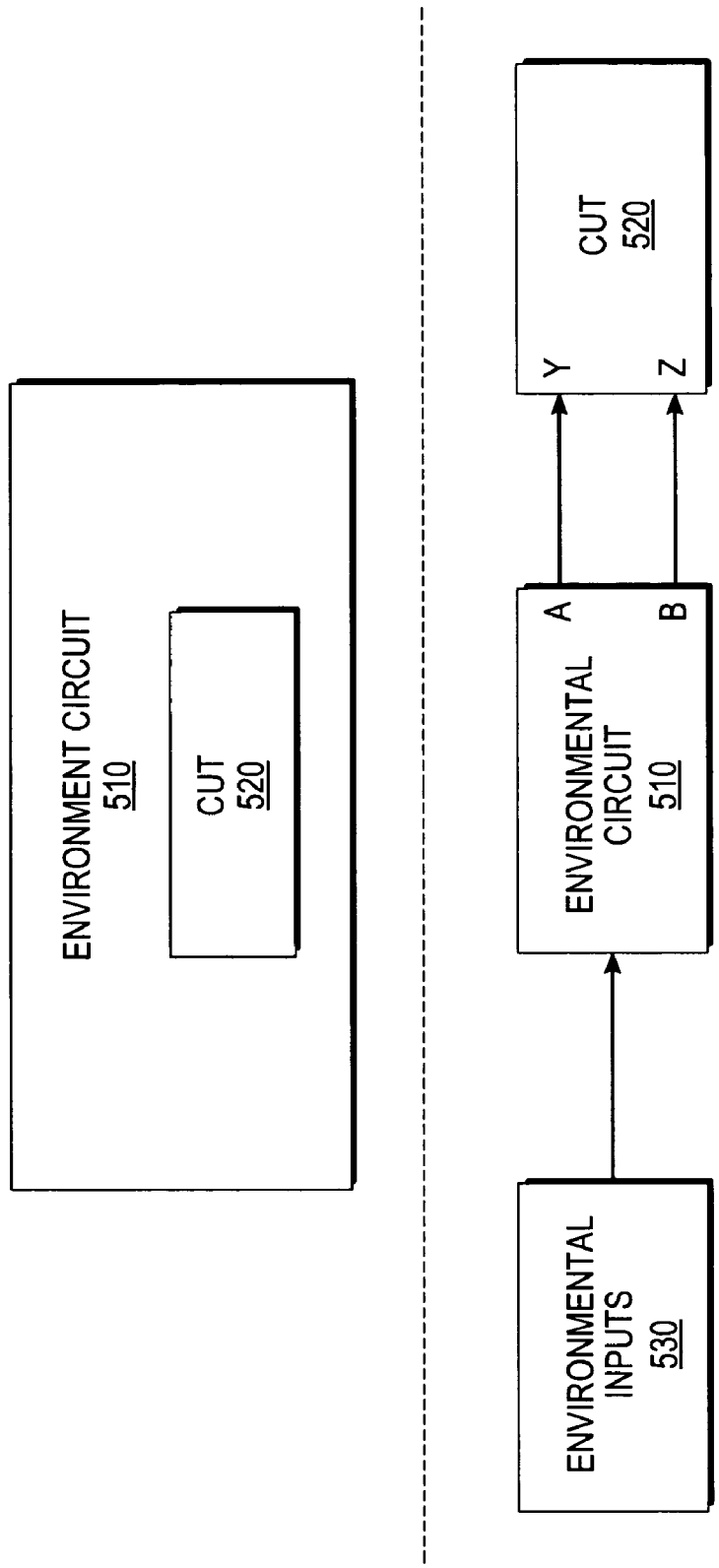
FIG. 5 is a block diagram illustrating a circuit having an environment circuit and a CUT according to an embodiment of the invention.

Note that the environment circuit 510 may supply any number of inputs to the CUT 520, as FIG. 5 only shows two inputs to the CUT 520 for ease of explanation. After the set of conditions for the environment circuit are established, processing proceeds to step 420.

In step 420, a set of environmental inputs to the environment circuit are applied to produce a set of environment outputs. The verification tool may apply a set of environmental inputs 530 to the environment circuit 510 to produce a set of environment outputs. The set of environmental inputs 530 provide inputs to the environment circuit 510. As explained in further detail below, the set of environmental inputs 530 may correspond to the outputs of a layer of a circuit higher than the level associated with the environment circuit. After the set of environment outputs are produced, processing proceeds to step 430.

In step 430, a determination is made as to whether the set of environmental outputs violate the set of conditions to determine whether the potential constraint set overconstrains inputs that can be applied to the CUT. The verification tool determines whether the outputs from the environment circuit 510 violate the set of conditions established in step 410. For example, if the set of conditions, established in step 410, indicate that the outputs from the environment circuit 510 should only consist of a set of output patterns, and the set of environment outputs contains a pattern that is not allowed by the set of conditions, then the set of environmental outputs would violate the set of conditions.

Significantly, if the set of environmental outputs produced by the environment circuit 510 violate the set of conditions, then that means that the environment circuit 510 is producing a pattern of output signals that is not reflected in the potential constraint set. In other words, the potential constraint set does not include a pattern that is produced by the environment circuit 510. Thus, the verification tool may conclude that the potential constraint set is overconstrained.

Using the above example, if the environment outputs from the environment circuit 510 included a pattern where both A and B were high ("1"), then that would violate the set of conditions for the environment circuit 510. As a result, the verification tool may determine that the potential constraint set for CUT 520 is overconstrained, since the potential constraint set for CUT 520 does not include the pattern where the input Y and input Z are both high ("1").

Importantly, the step of 430 is not performed to verify the design of the environment circuit 510, but rather to determine whether the potential constraint set to the CUT 520 overconstrains inputs that can be applied to the CUT 520.

Advantageously, using embodiments of the invention, the circuit designer may detect and correct overconstrained inputs with significantly less time, cost, and frustration than prior known methods.

Using the Verification Tool on Multiple Layers of a Circuit

In an embodiment, the verification tool may analyze different layers of a circuit in sequence. In other words, after an embodiment of the invention has analyzed a circuit at one level of granularity, the verification tool may analyze a different layer of the same circuit. In this way, the inputs to different layers of the circuit may be analyzed to determine if the inputs to a particular layer of the circuit are overconstrained. Before describing these techniques in further detail, a brief description of a circuit layer is provided.

Figure 6:
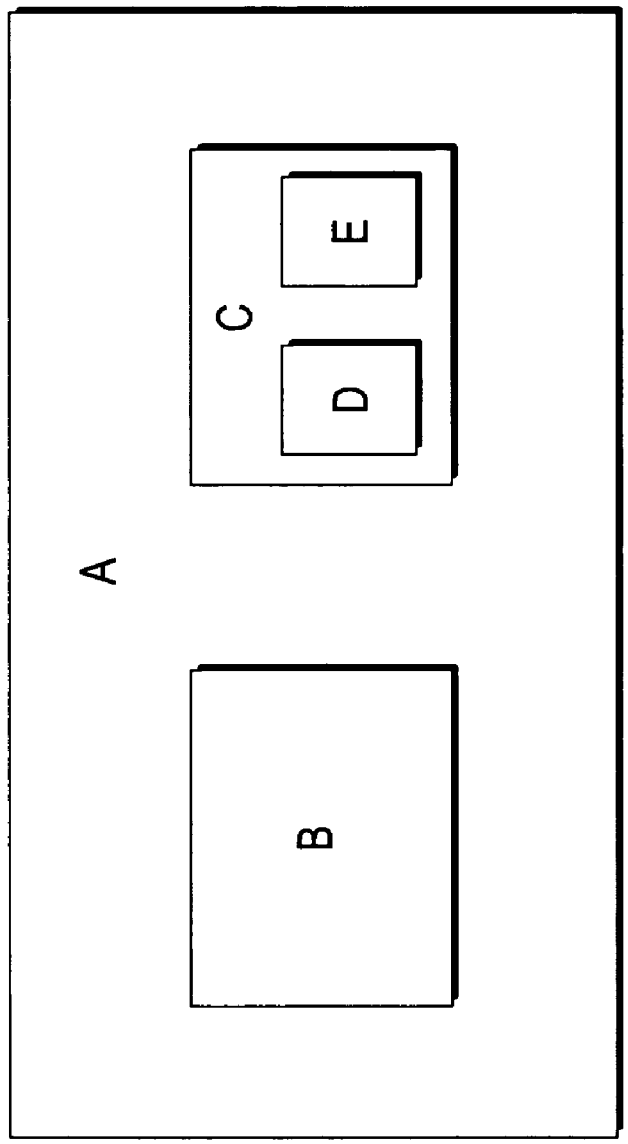
FIG. 6 is a first graphical depiction of a circuit having multiple layers.

When a circuit is designed, it is common for a circuit designer to create the design of the circuit using different layers. Each layer of the circuit may be responsible for performing tasks at different levels of granularity. For example, FIG. 6 is a graphical depiction of a circuit 600 having multiple layers named A, B, C, D, and E. Layers D and E of circuit 600 may each correspond to a set of circuit logic responsible for a certain set of tasks. Layer C of circuit 600 may correspond to a different set of circuit logic, which includes layers D and E, that is responsible for a certain set of tasks associated with a higher level of granularity than those tasks performed by layer D or layer E. Layer A of circuit 600 may correspond to a different set of circuit logic, which includes layers B and C (which includes layers D and E), that is responsible for a certain set of tasks associated with a higher level of granularity than those tasks performed by layers B and C. In this way, a circuit designer may design a first layer of the circuit, and thereafter add to the circuit by adding an additional layer around any existing layers to increase the complexity of tasks performed by the circuit.

Figure 7:
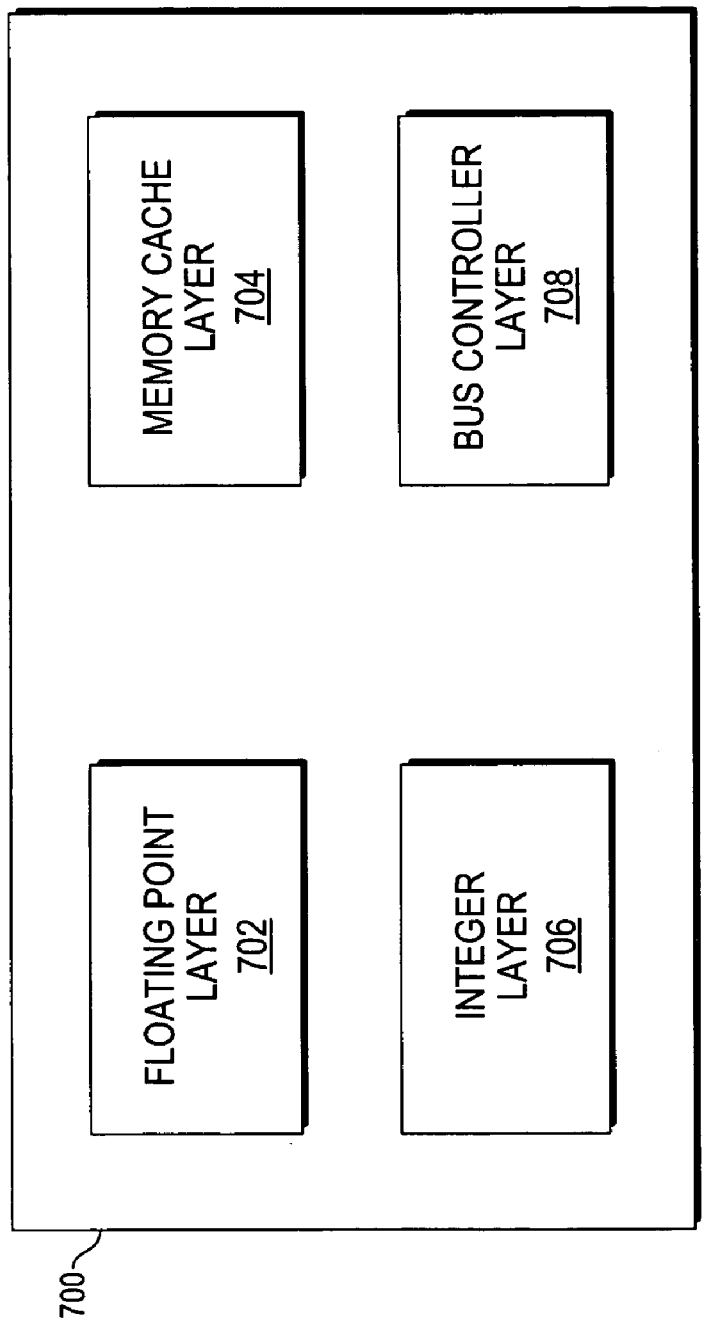
FIG. 7 is a second graphical depiction of a circuit having multiple layers.

A circuit layer may correspond to a specific set of tasks or functions. FIG. 7 is a graphical depiction of a circuit 700 having multiple layers, namely (1) floating point layer 702, which is responsible for floating point operations, (2) memory cache layer 704, which is responsible for memory cache operations, (3) integer layer 706, which is responsible for integer operations and (4) bus controller layer 708, which is responsible for bus controller operations. As shown in FIG. 7, each layer of the circuit is configured to performed different tasks, e.g., layer 704 is configured to perform memory cache operations while layer 708 is configured to perform bus controller operations.

Embodiments of the invention may analyze the different layers of a circuit to ensure that the inputs to each layer are not overconstrained. Returning again to FIG. 6, the verification tool may initially perform the steps of FIG. 4 using layer D as the CUT, and layer C as the environment circuit. Once the verification tool performs analysis on layer D, the verification tool may then perform the steps of FIG. 4 using layer E as the CUT and layer C as the environment circuit. Once layers D and E have been analyzed, the verification tool may "blackbox" layer C, that is to say, analyze the inputs to layer C to determine if the inputs to layer C are overconstrained, without analyzing the layers internal to layer C (i.e., layers D and E). The verification tool may then perform the steps of FIG. 4 using layer C as the CUT and layer A as the environment circuit, and so on. In this way, multiple levels of a circuit may be analyzed to identify any inputs, to any layers of a circuit, which are overconstrained.

Implementing Mechanisms

Figure 8:
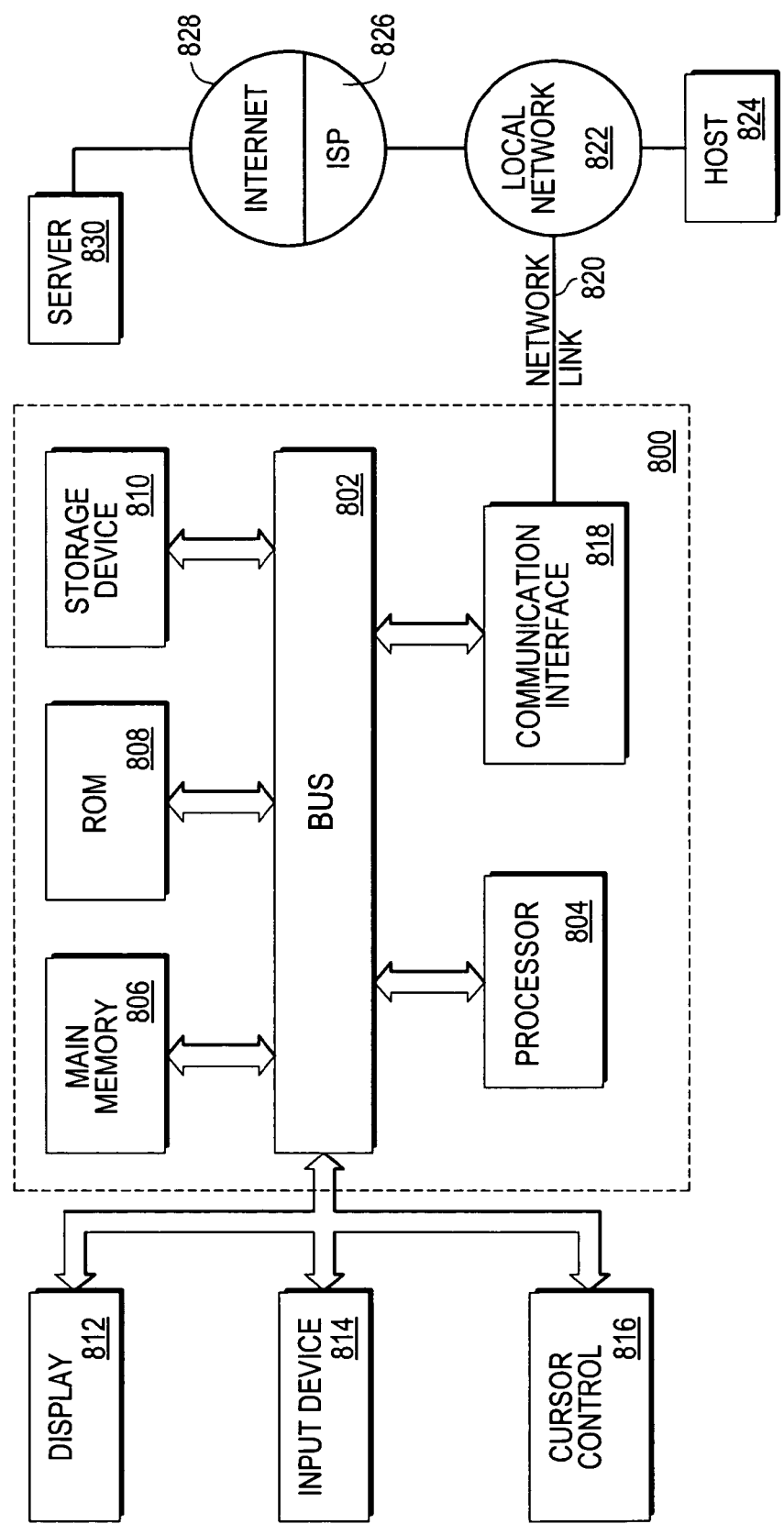
FIG. 8 is a block diagram that illustrates a computer system upon which an embodiment of the invention may be implemented.

The verification tool 200 may be implemented on a computer system according to an embodiment of the invention. FIG. 8 is a block diagram that illustrates a computer system 800 upon which an embodiment of the invention may be implemented. Computer system 800 includes a bus 802 or other communication mechanism for communicating information, and a processor 804 coupled with bus 802 for processing information. Computer system 800 also includes a main memory 806, such as a random access memory (RAM) or other dynamic storage device, coupled to bus 802 for storing information and instructions to be executed by processor 804. Main memory 806 also may be used for storing temporary variables or other intermediate information during execution of instructions to be executed by processor 804. Computer system 800 further includes a read only memory (ROM) 808 or other static storage device coupled to bus 802 for storing static information and instructions for processor 804. A storage device 810, such as a magnetic disk or optical disk, is provided and coupled to bus 802 for storing information and instructions.

Computer system 800 may be coupled via bus 802 to a display 812, such as a cathode ray tube (CRT), for displaying information to a computer user. An input device 814, including alphanumeric and other keys, is coupled to bus 802 for communicating information and command selections to processor 804. Another type of user input device is cursor control 816, such as a mouse, a trackball, or cursor direction keys for communicating direction information and command selections to processor 804 and for controlling cursor movement on display 812. This input device typically has two degrees of freedom in two axes, a first axis (e.g., x) and a second axis (e.g., y), that allows the device to specify positions in a plane.

The invention is related to the use of computer system 800 for implementing the techniques described herein. According to one embodiment of the invention, those techniques are performed by computer system 800 in response to processor 804 executing one or more sequences of one or more instructions contained in main memory 806. Such instructions may be read into main memory 806 from another machine-readable medium, such as storage device 810. Execution of the sequences of instructions contained in main memory 806 causes processor 804 to perform the process steps described herein. In alternative embodiments, hard-wired circuitry may be used in place of or in combination with software instructions to implement the invention. Thus, embodiments of the invention are not limited to any specific combination of hardware circuitry and software.

The term "machine-readable medium" as used herein refers to any medium that participates in providing data that causes a machine to operation in a specific fashion. In an embodiment implemented using computer system 800, various machine-readable media are involved, for example, in providing instructions to processor 804 for execution. Such a medium may take many forms, including but not limited to, non-volatile media, volatile media, and transmission media. Non-volatile media includes, for example, optical or magnetic disks, such as storage device 810. Volatile media includes dynamic memory, such as main memory 806. Transmission media includes coaxial cables, copper wire and fiber optics, including the wires that comprise bus 802. Transmission media can also take the form of acoustic or light waves, such as those generated during radio-wave and infra-red data communications.

Common forms of machine-readable media include, for example, a floppy disk, a flexible disk, hard disk, magnetic tape, or any other magnetic medium, a CD-ROM, any other optical medium, punchcards, papertape, any other physical medium with patterns of holes, a RAM, a PROM, and EPROM, a FLASH-EPROM, any other memory chip or cartridge, a carrier wave as described hereinafter, or any other medium from which a computer can read.

Various forms of machine-readable media may be involved in carrying one or more sequences of one or more instructions to processor 804 for execution. For example, the instructions may initially be carried on a magnetic disk of a remote computer. The remote computer can load the instructions into its dynamic memory and send the instructions over a telephone line using a modem. A modem local to computer system 800 can receive the data on the telephone line and use an infra-red transmitter to convert the data to an infra-red signal. An infra-red detector can receive the data carried in the infra-red signal and appropriate circuitry can place the data on bus 802. Bus 802 carries the data to main memory 806, from which processor 804 retrieves and executes the instructions. The instructions received by main memory 806 may optionally be stored on storage device 810 either before or after execution by processor 804.

Computer system 800 also includes a communication interface 818 coupled to bus 802. Communication interface 818 provides a two-way data communication coupling to a network link 820 that is connected to a local network 822. For example, communication interface 818 may be an integrated services digital network (ISDN) card or a modem to provide a data communication connection to a corresponding type of telephone line. As another example, communication interface 818 may be a local area network (LAN) card to provide a data communication connection to a compatible LAN. Wireless links may also be implemented. In any such implementation, communication interface 818 sends and receives electrical, electromagnetic or optical signals that carry digital data streams representing various types of information.

Network link 820 typically provides data communication through one or more networks to other data devices. For example, network link 820 may provide a connection through local network 822 to a host computer 824 or to data equipment operated by an Internet Service Provider (ISP) 826. ISP 826 in turn provides data communication services through the world wide packet data communication network now commonly referred to as the "Internet" 828. Local network 822 and Internet 828 both use electrical, electromagnetic or optical signals that carry digital data streams. The signals through the various networks and the signals on network link 820 and through communication interface 818, which carry the digital data to and from computer system 800, are exemplary forms of carrier waves transporting the information.

Computer system 800 can send messages and receive data, including program code, through the network(s), network link 820 and communication interface 818. In the Internet example, a server 830 might transmit a requested code for an application program through Internet 828, ISP 826, local network 822 and communication interface 818.

The received code may be executed by processor 804 as it is received, and/or stored in storage device 810, or other non-volatile storage for later execution. In this manner, computer system 800 may obtain application code in the form of a carrier wave.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A method for determining whether a potential constraint set for a circuit under test (CUT) overconstrains inputs that can be applied to the CUT, the method comprising:

allowing a user to describe a potential constraint set for the CUT, wherein the potential constraint set specifies inputs that the user believes can be applied to the CUT by an environment circuit during operation;

establishing, based upon the potential constraint set, a set of conditions for the environment circuit, wherein the set of conditions sets forth limitations on what outputs are expected to be generated by the environment circuit during operation;

applying a set of environmental inputs to the environment circuit to produce a set of environmental outputs;

determining whether the set of environmental outputs violate the set of conditions; and in response to a determination that the set of environmental outputs violate the set of conditions, concluding that the potential constraint set overconstrains inputs that can be applied to the CUT.

2. The method of claim 1, wherein the step of determining whether the set of environmental outputs violate the set of conditions is not performed to verify the environment circuit.

3. The method of claim 1, wherein the set of conditions and the potential constraint set are expressed in a hardware description language (HDL).

4. The method of claim 1, wherein the step of establishing the set of conditions for the environment circuit comprises:

updating signal names, within the potential constraint set, to reflect names of output signals from the environment circuit.

5. The method of claim 1, wherein the environmental inputs represent inputs that are expected to be applied to the environment circuit by another circuit during operation, and wherein the method further comprises determining whether the environmental inputs overconstrain inputs that can be applied to the environment circuit by the other circuit during operation.

6. A machine-readable storage medium carrying one or more sequences of instructions which, when executed by one or more processors, cause the one or more processors to perform the steps of:

allowing a user to describe a potential constraint set for a circuit under test (CUT), wherein the potential constraint set specifies inputs that the user believes can be applied to the CUT by an environment circuit during operation;

establishing, based upon the potential constraint set, a set of conditions for the environment circuit, wherein the set of conditions sets forth limitations on what outputs are expected to be generated by the environment circuit during operation;

applying a set of environmental inputs to the environment circuit to produce a set of environmental outputs;

determining whether the set of environmental outputs violate the set of conditions; and in response to a determination that the set of environmental outputs violate the set of conditions, concluding that the potential constraint set overconstrains inputs that can be applied to the CUT.

7. The machine-readable storage medium of claim 6, wherein the step of determining whether the set of environmental outputs violate the set of conditions is not performed to verify the environment circuit.

8. The machine-readable storage medium of claim 6, wherein the set of conditions and the potential constraint set are expressed in a hardware description language (HDL).

9. The machine-readable storage medium of claim 6, wherein the step of establishing the set of conditions for the environment circuit:

updating signal names, within the potential constraint set, to reflect names of output signals from the environment circuit.

10. The machine-readable storage medium of claim 6, wherein the environmental inputs represent inputs that are expected to be applied to the environment circuit by another circuit during operation, and wherein execution of the one or more sequences of instructions by the one or more processors further causes the one or more processors to perform the step of:

determining whether the environmental inputs overconstrain inputs that can be applied to the environment circuit by the other circuit during operation.

* * * * *